United States Patent
Blomgren et al.

(10) Patent No.: US 6,460,134 B1
(45) Date of Patent: Oct. 1, 2002

(54) METHOD AND APPARATUS FOR A LATE PIPELINE ENHANCED FLOATING POINT UNIT

(75) Inventors: James S. Blomgren; Terence M. Potter, both of Austin; Jeffrey S. Brooks, Round Rock, all of TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

(21) Appl. No.: 09/181,406

(22) Filed: Oct. 28, 1998

Related U.S. Application Data

(60) Provisional application No. 60/069,250, filed on Dec. 11, 1997, and provisional application No. 60/067,220, filed on Dec. 3, 1997.

(51) Int. Cl.$^7$ ................................................ G06F 9/30
(52) U.S. Cl. ....................................................... 712/219
(58) Field of Search .......................................... 712/219

(56) References Cited

U.S. PATENT DOCUMENTS

| | | | |
|---|---|---|---|
| 4,879,676 A | | 11/1989 | Hansen |
| 5,424,734 A | * | 6/1995 | Hirahara et al. ............... 341/79 |
| 5,633,819 A | | 5/1997 | Brashears et al. |
| 5,768,478 A | * | 6/1998 | Batten, Jr. .................... 395/24 |
| 5,841,298 A | * | 11/1998 | Huang .......................... 326/97 |
| 6,052,770 A | * | 4/2000 | Fant ............................. 712/14 |
| 6,069,497 A | * | 5/2000 | Blomgren et al. |
| 6,118,304 A | * | 9/2000 | Potter et al. |

* cited by examiner

Primary Examiner—John A. Follansbee
(74) Attorney, Agent, or Firm—Booth & Wright, LLP; Matthew J. Booth

(57) ABSTRACT

The present invention comprises a method and apparatus for a pipeline of functional units with a late pipe functional unit that executes instructions without stalling until the result is available. The present invention comprises one or more earlier functional units coupled to a late pipe functional unit. The late pipe functional unit does not begin executing instructions until all of the input operands are or will be available for execution so that the late pipe functional unit will execute instructions without stalling until the result will be available in a fixed number of cycles. The present invention further comprises a late pipe functional unit that may comprise a floating point unit, a graphics unit, or an enhanced floating point unit. And finally, the late pipe functional unit is non-stalling and or is non-cancelable.

9 Claims, 11 Drawing Sheets

METHOD AND APPARATUS FOR A LATE PIPELINE ENHANCED FLOATING POINT UNIT

This application claims the benefits of the earlier filed U.S. Provisional Application Ser. No. 60/069,250, filed Dec. 11, 1997, which is incorporated by reference for all purposes into this application.

Additionally, this application claims the benefits of the earlier filed U.S. Provisional Application Serial No. 60/067,220, filed Dec. 3, 1997, which is incorporated by reference for all purposes into this application.

BACKGROUND OF THE INVENTION

1. Field of the Invention

The present invention relates to the field of digital electronic processors; more particularly, to processors designed for high-speed pipelined synchronous operation.

2. Description of the Related Art

Advances in digital electronic data processors have included process, circuit and microarchitecture improvements. Microarchitecture improvements have leveraged the fact that improving processes have allowed the integration of millions of devices on individual integrated circuits (ICs). With millions of devices available for very little cost, microarchitectures have evolved to deliver greater performance, even though individual devices contribute less to overall performance than in earlier microarchitectures.

One approach that researchers and scientists have investigated for improving performance is to increase the frequency at which the device operates. This is accomplished by using more aggressive circuit families such as dynamic gates, and by implementing fewer gates in each pipeline stage. Another approach is to implement multiple execution units such that more than one instruction can be executed at a time. Yet another approach is to allow each instruction to proceed at its own pace, beginning execution when encountered but not completing execution until all operands and resources are available. Pipelining all the functional units is known as super pipelining. Executing more than one instruction at a time is known as super scalarity, and allowing instructions to complete at their own pace is known as out-of-order. Most modern microarchitectures support some degree of each of these innovations. An efficient microarchitecture makes efficient use of its circuits. Super scalarity and out-of-order features reduce circuit efficiency because, in the case of super scalarity, multiple redundant units are present. That is, a super scalar design includes two or more ALUs, and both ALUs are used less frequently than one ALU is used in a uniscalar (non-super scalar) design.

Out-of-order features also reduce circuit utilization efficiency because of the additional control hardware required to track individual instructions and ensure that they appear to complete in the proper order as expected by the executing program. Super pipelining has the potential of increasing circuit utilization because it can operate individual circuits at a higher clock rate, but because of the synchronization requirements, i.e., latches, the percent of each stage doing actual work is reduced, which tends to offset efficiency gains. In otherwords, increased instruction latency decreases circuit efficiency.

Due to the complexity of modem processors, internal synchronization often requires pipeline stalls. This is because it is not necessarily known whether all resources required for an instruction to execute will be present when the instruction is initiated. For example, a store instruction may begin execution, generating an address and translating it from a virtual to a physical address before the register value to be stored is available. If the instruction gets to the point where the register value is required but is not yet available, the instruction will stall until such point as the register value appears. While these stalls are conceptually simple to implement, they often introduce critical paths into a design. Furthermore, the cost of such stalls is often overlooked as they represent additional circuitry present to manage instruction operation but not do any actual work. A stall, therefore, decreases circuit utilization.

Circuit utilization is important when designing processors that must balance performance against other issues such as silicon cost, power, heat dissipation and manufacturability. It is not particularly important when the only important criteria is absolute performance. When it is necessary to deliver the greatest performance for the minimum cost, for example, circuit utilization is an important metric. As such, super scalarity and out-of-order features are unattractive, and super pipelining is attractive only when synchronization elements need not be included in the critical path.

The present invention focuses on high circuit utilization by combining a floating point unit with a graphics unit and an integer unit. It does so by implementing super pipelining in a latchless dynamic logic family, which requires no additional logic levels for synchronization. It avoids super scalarity except where functional units are sufficiently different to justify not building a single consolidated unit. It allows operations to occur at their natural latency. In other words, individual instructions deliver their results as soon as their execution unit produces them, limiting the out-of-order nature of the design to where it occurs naturally. And, it simplifies operand bypass logic by having each subsequent stage of the pipeline pass previously generated results unaffected. Finally, by predicting complex operand conditions, operand availability, execution unit availability, and write ordering, it eliminates all non-calculating stall conditions, which eliminates the need for recirculation circuits.

Additionally, the present invention illustrates the need for locating a combination functional unit at a late stage within a pipeline. Late pipeline functional units have implementation cost and simplicity advantages over a traditional, early pipeline location. If properly designed, late pipeline functional units do not need to support partial or complete cancellation, and can avoid all pipeline stalls. A late pipeline functional unit can therefore be designed without recirculating hold paths such that it is free-running, e.g., once an operation is dispatched, it will proceed in a regular, predictable fashion. There are some costs to placing units late in a pipeline, but these are considered minor.

SUMMARY

The present invention comprises a method and apparatus for an enhanced floating point unit that supports floating point, integer, and graphics operations by combining the units into a single functional unit. The enhanced floating point unit comprises a register file coupled to a plurality of bypass multiplexers. Coupled to the bypass multiplexers are an aligner and a multiplier. And, coupled to the multiplier is an adder that further couples to a normalizer/rounder unit. The normalizer/rounder unit may comprise a normalizer and a rounder coupled in series and or a parallel normalizer/rounder. The enhanced floating point unit of the present invention supports both integer operations and graphics operations with one functional unit.

Additionally, the present invention comprises a method and apparatus for a pipeline of functional units with a late pipe functional unit that executes instructions without stalling until the result is available. The present invention comprises one or more earlier functional units coupled to a late pipe functional unit. The late pipe functional unit does not begin executing instructions until all of the input operands are or will be available for execution so that the late pipe functional unit will execute instructions without stalling until the result will be available in a fixed number of cycles. The present invention further comprises a late pipe functional unit that may comprise a floating point unit, a graphics unit, or an enhanced floating point unit. And finally, the late pipe functional unit is non-stalling and or is non-cancelable.

DETAILED DESCRIPTION OF THE INVENTION

Figure 1:
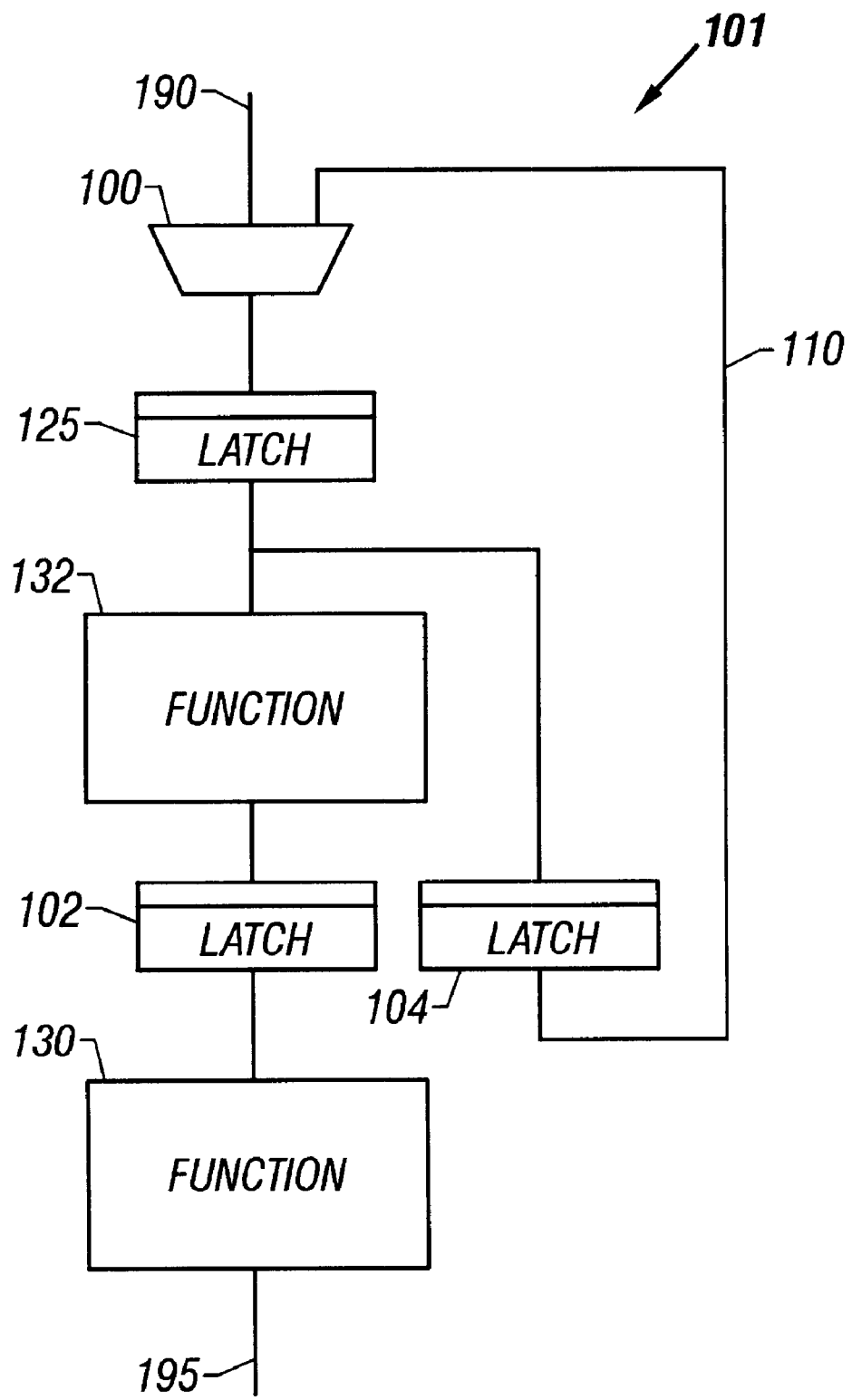
FIG. 1 is a diagram of a prior art single latch-style static pipeline stage that is capable of stalling.

The present invention comprises a floating point unit, and an integer unit, and a graphics unit combined into a single functional unit. This disclosure describes numerous specific details that include specific structures, circuits, and logic functions in order to provide a thorough understanding of the present invention. One skilled in the art will appreciate that one may practice the present invention without these specific details.

The present invention is a careful arrangement of function operations and latencies that simplifies datapath and control logic, allows for maximum operating frequency, and supports a rich set of functions. The present invention accomplishes these goals by leveraging several important observations of the cost of performing the functions in an environment where resource availability is otherwise unpredictable. One observation is that a substantial portion of hardware cost comes from the requirement that the pipeline must be stalled, and the present invention avoids this cost by eliminating stall conditions. Another observation is the cost of bypassing results that are generated at different latencies, which the present invention reduces by carefully constructing execution units that can be shared and that generate intermediate results that are correct for low-latency operations.

The present invention implements a pipelined processor with a minimum of functional units and supporting control logic to support as rich a set of operations as is practical. The invention ensures high functional unit utilization by consolidating multiple functions into single units. Floating point, integer, and graphics instructions are supported by the same functional unit. This prevents the pipeline from executing both an integer and a floating point instruction at the same time in the same functional unit, but in return avoids periods of low utilization when instruction sequences are encountered that do not include both instruction types.

Consolidating multiple functional units places restrictions on when results are generated. For example, a floating point unit comprises a multiplier and operand aligner in an early stage, adder in a middle stage, and a normalizer and rounder in a final stage. To support integer instructions it is possible to perform shifts in the aligner, additions and subtractions in the adder, and multiplies in the combination of the multiplier and adder. While it is possible to perform an addition in the first pipeline stage, the fact that there is no adder in this stage means that the addition can not be performed until the second stage, making the addition result unavailable until the second stage. This increased latency is one of the compromises required to increase circuit utilization.

Finally, control logic is drastically reduced by ensuring that instructions can proceed in a deterministic fashion before they are released for execution. This also eliminates the need for expensive holding circuits for cases where the pipeline must stall. Determining that an instruction will proceed deterministically requires that all resources and operands be available, or that it be known that they will be available when they are required. A pipeline that executes without stalling, for example, can ensure that each stage is available when needed since it is known that each stage is used for only one cycle, and that instructions proceed through a pipeline one stage after the other. Register file write ports are strictly assigned to specific stages, and results generated earlier than the pipeline stage where they are to be written into the register file proceed through each remaining stage unaltered. Operand bypass hardware can therefore be connected to intermediate points in the pipeline for all possible results, including those which are generated early. The preferred embodiment of the invention uses N-NARY logic and the logic synchronization techniques as disclosed in copending applications, U.S. patent application Ser. No. 09/019244, filed Feb. 5, 1998, now U.S. Pat. No. 6,069,497, entitled "Method and Apparatus for an N-Nary logic circuit using 1 of N signals," and U.S. patent application Ser. No. 09/179,330, filed Oct. 27, 1998 entitled "Method and Apparatus for Logic Synchronization," now U.S. Pat. No. 6,118,304, both of which are incorporated by reference into this application. While the present invention has advantages for both latched-based and flip-flop-based static logic families, the elimination of synchronization elements in the latchless clocking method makes the advantages of the invention more pronounced.

The Cost of Stalling a Pipeline

FIG. 1 depicts a prior-art static logic pipeline stage 101. Pipelined processors consist of sequences of stages connected one after the other. Bypass mux 100 selects either inputs from the previous stage 190 or held values from within the stage along bypass path 110. When operating without stalls, input 190 is selected by bypass mux 100 at the end of a previous clock period. The output of this mux is connected to latch 125. In typical latch-based clocking methods, this is considered a master latch. The output from the master latch is connected to the first block of functional logic circuit 132 that performs some logic function used in the pipeline stage. The first function block's output is connected to another latch 102, typically a slave latch, and the output from the slave latch is connected to an additional functional logic circuit 130 that completes the function implemented by the pipeline stage. Synchronization operates by allowing only one of the two latches, 125 and 102, to pass a value through at a time. Clock synchronization is not discussed here so as not to obscure the present invention.

When operating the pipeline of FIG. 1 with stalls, it is necessary for latch 125 to retain the same contents for more than one cycle. For this to operate, the old value must be selected on bypass mux 100 from bypass path 110. Latch 104 has its input connected to the output of latch 125 such that it obtains the old value in latch 125 before latch 125 obtains its next value. Typically, this means that latch 125 is a master latch and 104 is a slave, where only one of the two latches, 125 and 104, pass a value through at any point in time. Note that this arrangement allows functional logic 132 and 130 to perform their operations in anticipation of sending their result to the next pipeline stage along path 195 while latch 104 prepares the value on bypass path 110 in the event the pipeline stage must be held. This arrangement allows a late determination of whether the pipeline stage needs to be held or not. That is, we do not need to know until the very end of the pipe stage if it needs to be held an additional cycle, which is desirable for implementations where holds are not known until very late.

Figure 9:
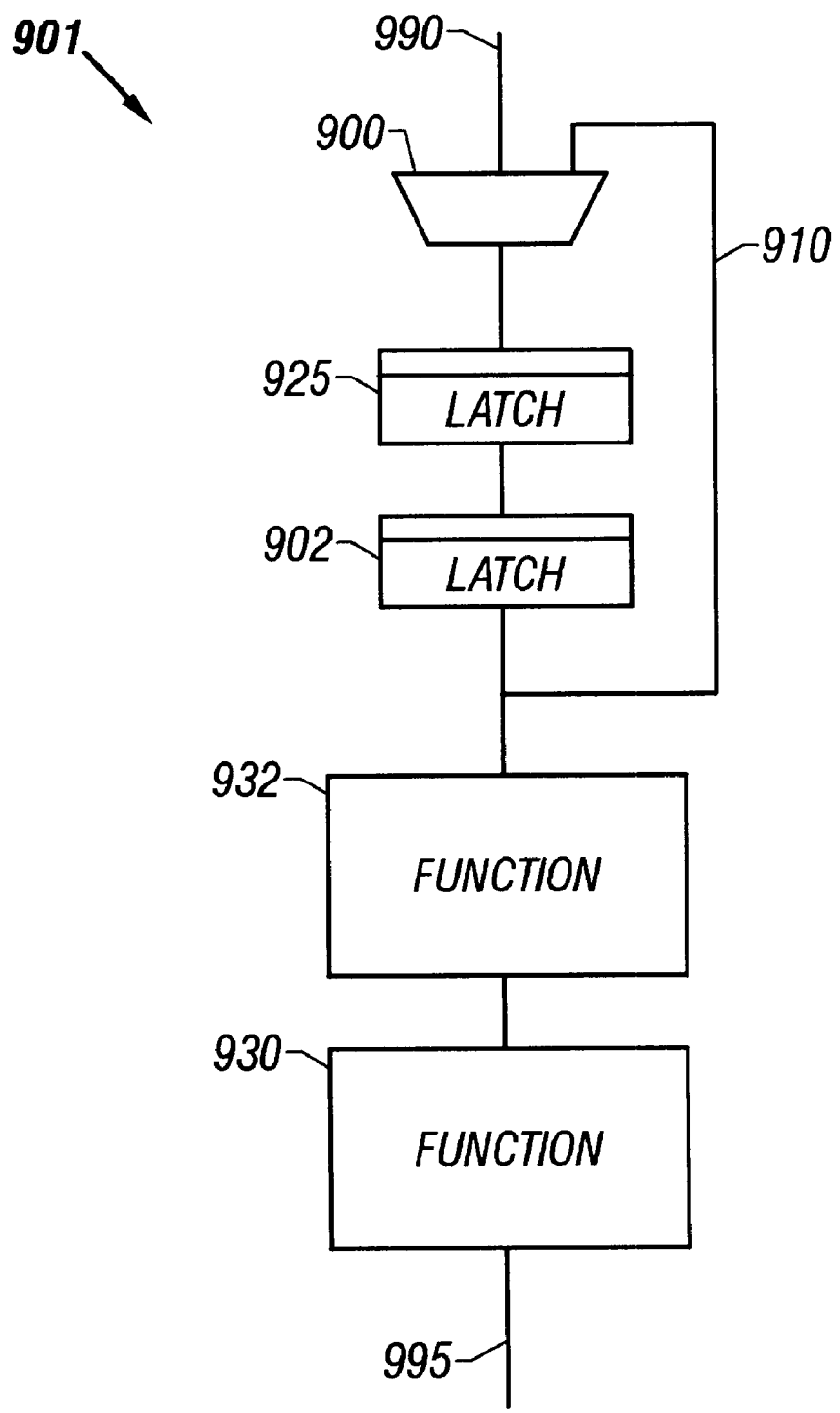
FIG. 9 is a diagram of a prior art single flip-flop-style static pipeline stage that is capable of stalling.

FIG. 9 depicts a common prior-art variation on a static logic pipeline stage 901. In this case latch 902 and functional logic 932 are swapped in order relative to FIG. 1. This arrangement allows the output from the slave latch 902 to be used for both the bypass path 910 and feeding the first functional logic 932, which eliminates the need for a separate latch (such as latch 104 in FIG. 1). While this variation reduces hardware, it suffers from an inability to cycle-steal across latch boundaries because one of the two latches, 925 and 902, do not transfer their input to their output at any given time. Since at least one of the latches is "opaque" at any point in time, the two latches together are "opaque" at all times.

Figure 3:
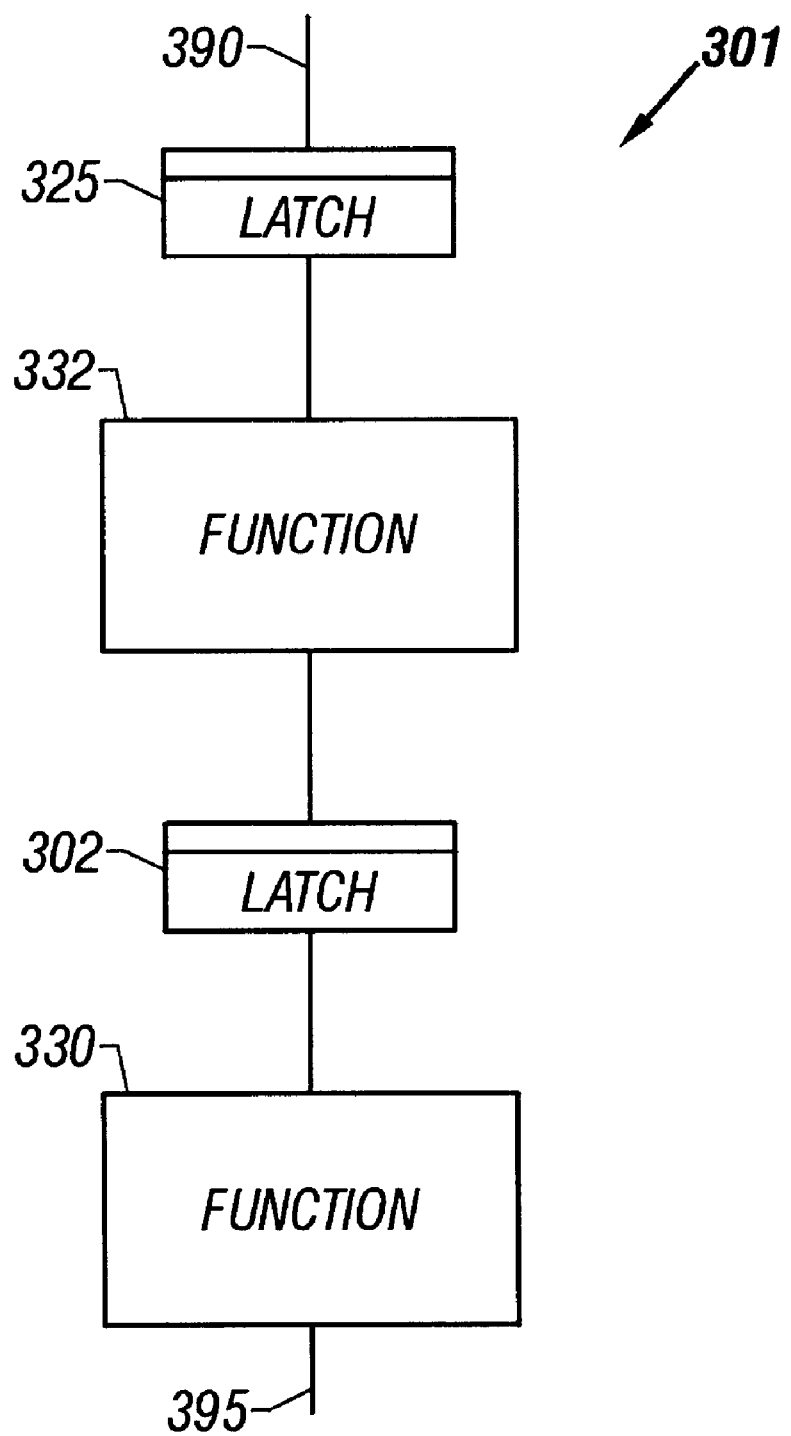
FIG. 3 is a diagram of a prior art single static pipeline stage that cannot stall.

FIG. 3 depicts a static latched-based pipeline stage 301 that does not need to stall. While non-stalling pipeline stages are often used in memory subsystems, they are not used in main processor pipelines because it is difficult to eliminate all stall conditions. An example of one common type of stall are cache misses. However, in processors without caches, external memories cause stalls when they require additional time to present their values to the processor. Otherstalls include multi-cycle operations, exceptional conditions, unavailable execution units or execution resources, register or other operand conflicts. In fact, stalls are one of the most useful tools microprocessor designers have for managing execution flow. Nonetheless, non-stalling pipeline stages are used in memory subsystems and other pipelined units adjacent to the main processor pipeline, they simply are not used in the main pipeline. Since the pipeline stage in FIG.3 need not stall, there is no need for the stage to retain the input value from one cycle to be available for use the next cycle. Therefore, the slave latch 104 and bypass path 110 required in FIG. 1 are not required in FIG. 3. Furthermore, the bypass mux 100 is not required. The arrangement of the remaining latches, 325 and 302, and functional blocks 332 and 330 is the same. If each block of logic, whether a bypass mux, a functional block or a latch, takes one unit of time, but only the functional blocks do any actual work, then the pipeline stages of FIGS. 1 and 9 do two units of work in five units of time. (FIG. 1 has the additional advantage of providing cycle stealing, which eliminates some of the penalty associated with clock inaccuracies such as jitter and skew). The pipeline stage of FIG. 3 does two units of work in four units of time, therefore the efficiency of the non-stalling stage is 25% greater than the stalling stage. Assuming functional blocks take the same amount of time as latches or bypass muxes is not realistic for static logic families, however, simply because of the cost of synchronization and holding circuits. As a result, static designs implement many levels of logic in each of their functional blocks, primarily to amortize the cost of master and slave latches across a greater amount of functionality. A functional block, for example, may consist of a 32-bit adder that itself may require 10 levels of logic.

A recent trend in microprocessor design, however, has been to deeply pipeline operations. Deep pipelining means that less work is done in each stage to allow the stages to operate more quickly. This technique, however, does nothing to improve the latency of operations. That is, if an addition is started at time T the results will be available at time T+P independent of the depth of the pipeline, but a deep pipeline will be able to perform more additions per unit in time than will a shallow pipeline.

N-nary logic and the latchless clocking method (Logic Synchronization) changes the equation drastically. The elimination of latch elements 125 and 102 in the static method increases the fraction of time required for pipeline holding, making it much less acceptable. Furthermore, since each N-nary gate is able to implement much more complex functions than a static gate, it is reasonable to construct pipeline stages with as few as three gates in series.

Figure 2:
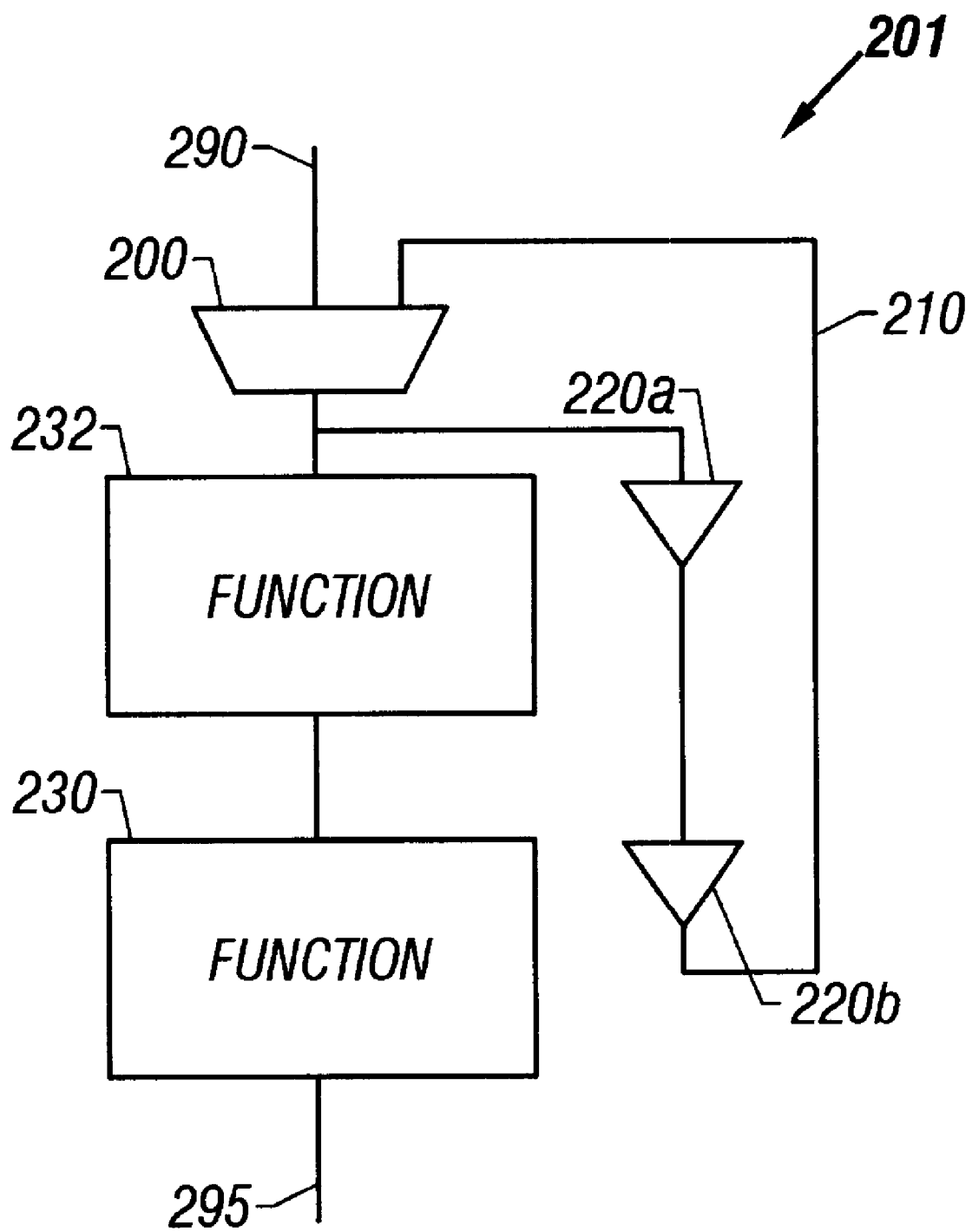
FIG. 2 is a diagram of a single N-nary pipeline stage that is capable of stalling.

FIG. 2 is a depiction of the N-nary latchless family implementing a N-NARY pipeline stage 201 that is able to hold its value. When operating in the absence of holds, N-NARY bypass mux 200 selects the input from the previous stage on input 290. Bypass mux 200 couples to N-NARY functional block 232, which is in turn coupled to N-NARY functional block 230. The output of this last N-NARY functional block is sent to the next pipeline stage on connection 295. When operating in the presence of holds, the output of bypass mux 200, which is connected to N-NARY buffers 220a and 220b in series, generates a hold value on bypass path 210 and is selected by bypass mux 200. The timing of this pipeline is similar to the static implementation. That is, it need not be determined if the stage must hold or not until late in the cycle. Buffers 220a and 220b are required for synchronization purposes, similar to the requirement for the slave latch 104 in FIG. 1, and while the buffers do not impact the critical path they do require additional area. Latching and buffering are discussed in greater detail in the copending logic synchronization application. The presence of the mux and buffers reduces the efficiency of the pipeline stage to two units of work in three units of time. What is desired is an implementation where holds are not required such that all hardware can be devoted to doing real work.

Figure 4:
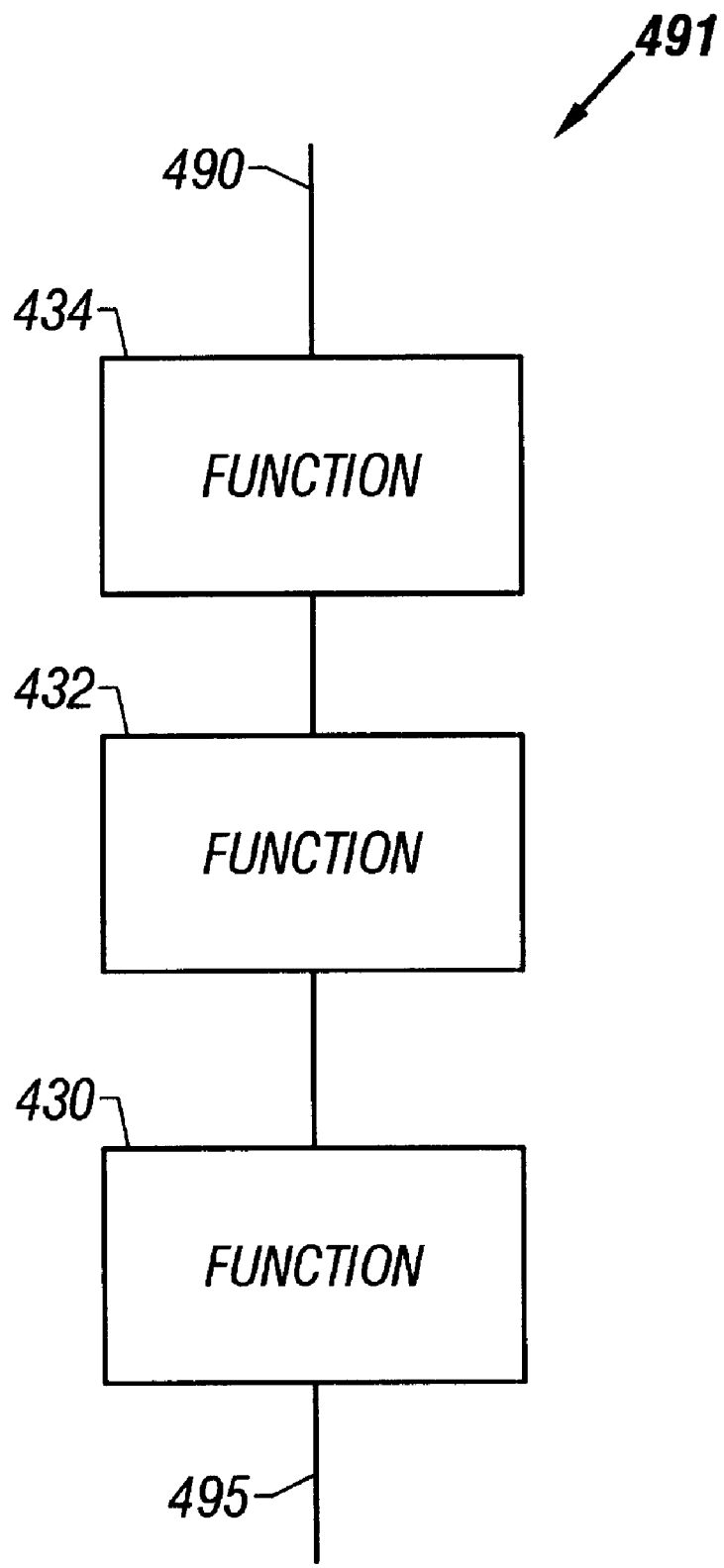
FIG. 4 is a diagram of a single N-nary pipeline stage that cannot stall.

FIG. 4 is an embodiment of a non-stalling N-nary latchless pipeline stage 491. The input from a previous stage is connected to first N-NARY functional block 434 along connection 490. N-nary functional blocks 434, 432 and 430 are connected in series, and the output from the stage is connected to the next pipeline stage with connection 495. With this arrangement, every gate performs functional work, and we achieve the greatest functional efficiency.

Traditional static logic pipeline design includes substantial hardware to support synchronization and pipeline hold functions. This hardware reduces the actual amount of real work performed in each pipeline stage. Elimination of the hold requirement reduces the overhead somewhat, but the gain is usually considered so small as to be uncompelling. This is because master and slave latches are unavoidable, so most of the pipeline management elements cannot be eliminated anyway. Static pipeline stages that must support stalling have a maximum clock rate efficiency of 40% (2 of 5 stages), but if stalling need not be supported, the efficiency increases to 50% (2 of 4 stages). The N-nary latchless logic family, on the other hand, achieves 67% efficiency when stalling must be supported, or 100% when stalling need not be supported. Due to the substantial cost of stalling in the N-nary latchless logic family, it is essential to avoid stalling if at all possible. One motivation for the present invention is to avoid stall situations.

Avoiding Stalls in a Pipeline

The need to avoid stalls requires the design to be constructed such that all operation sources and sinks are known to be available at the correct times, and that the functional units be available at the appropriate times as well. Recent trends in microarchitecture have been contrary to these objectives, particularly super scalar and out-of-order techniques. Out-of-order techniques introduce a variety of previously nonexistent conditions. For example, an instruction that is otherwise complete can not be allowed to write its result if an older instruction, one that should finish first, has not completed. A microarchitectural feature known as a retire queue is usually included in out-of-order pipelines to ensure instructions finish in the proper order, and this feature introduces stall conditions late in execute pipelines. Super scalarity can also introduce stall conditions, especially when multiple pipelines produce results at different times. Again, the order that results are written must be preserved.

Instructions dispatched to non-stalling pipelines must not be dispatched until it is known they will either (1) complete without stalling, or (2) be canceled along with all younger instructions that may be present in the pipeline when they are canceled. Ensuring (1) is true requires careful arrangement of pipeline resources. Before an instruction can be dispatched, the pipeline must ensure the following conditions:

(A) All input operands are available now, or will be available when they are required.

(B) All execution resources (the pipeline itself) is available.

(C) The result can be written once it is generated without delay.

(D) No operations already in the pipeline require multiple cycles in any single non-stalling stage.

Note that if stage N of a pipeline must stall, then all earlier stages must also stall. Our desire is to avoid stalling in as many stages as possible. The expense to stall later stages is much greater than to stall earlier stages since late-stage stalls imply early-stage stalls. Therefore, the preferred embodiment of the present invention is to only dispatch instructions when it is known they will not stall. The dispatch stage, in effect, can stall, since it waits until the proper time to dispatch instructions. Once dispatched, however, instructions never need to stall. Some performance is lost with this implementation, and partly for this reason it is typically not used in processor pipelines. The store instruction, for example, does not require the operand to be stored until the address has been generated, but this operand may be from a previous (younger) load instruction. Since it may not be known whether the load has succeeded before the store is to be dispatched, it can't be known whether a stall will be generated for the store operand. Therefore, it is necessary to prevent dispatch of the store instruction until it is known the load will not encounter a cache miss, which usually means the store operand is available a few stages before it is required. These few cycles of additional latency are unavoidable if we wish to eliminate stalling from the pipeline. The increased functionality of non-stalling pipelines more than makes up for this inefficiency, especially in the N-nary logic family.

The Cost of Bypassing from Multiple Sources

Eliminating the need to stall pipeline stages eliminates the need for clocking elements, either latches in the static style or buffers in the N-nary latchless style, however it does not necessarily eliminate the need for bypass muxes. If operand bypassing is required from one instruction's result to a subsequent instruction's input, then bypass muxes must be included. While on the surface these muxes may appear to be the same as the muxes required for holding pipeline stages, they are in fact quite different. Operand bypass muxes (as opposed to pipeline stage holding muxes) are present only at the first stage of a pipeline, since input operands are only accepted at the beginning of the pipeline. Furthermore, the control for pipeline holding is usually independent of the control for determining bypasses, which requires that two sequential muxes be included where bypass AND hold are both required. As a result, we consider operand bypass muxes to be an orthogonal consideration when attempting to construct an efficient design.

Figure 5:
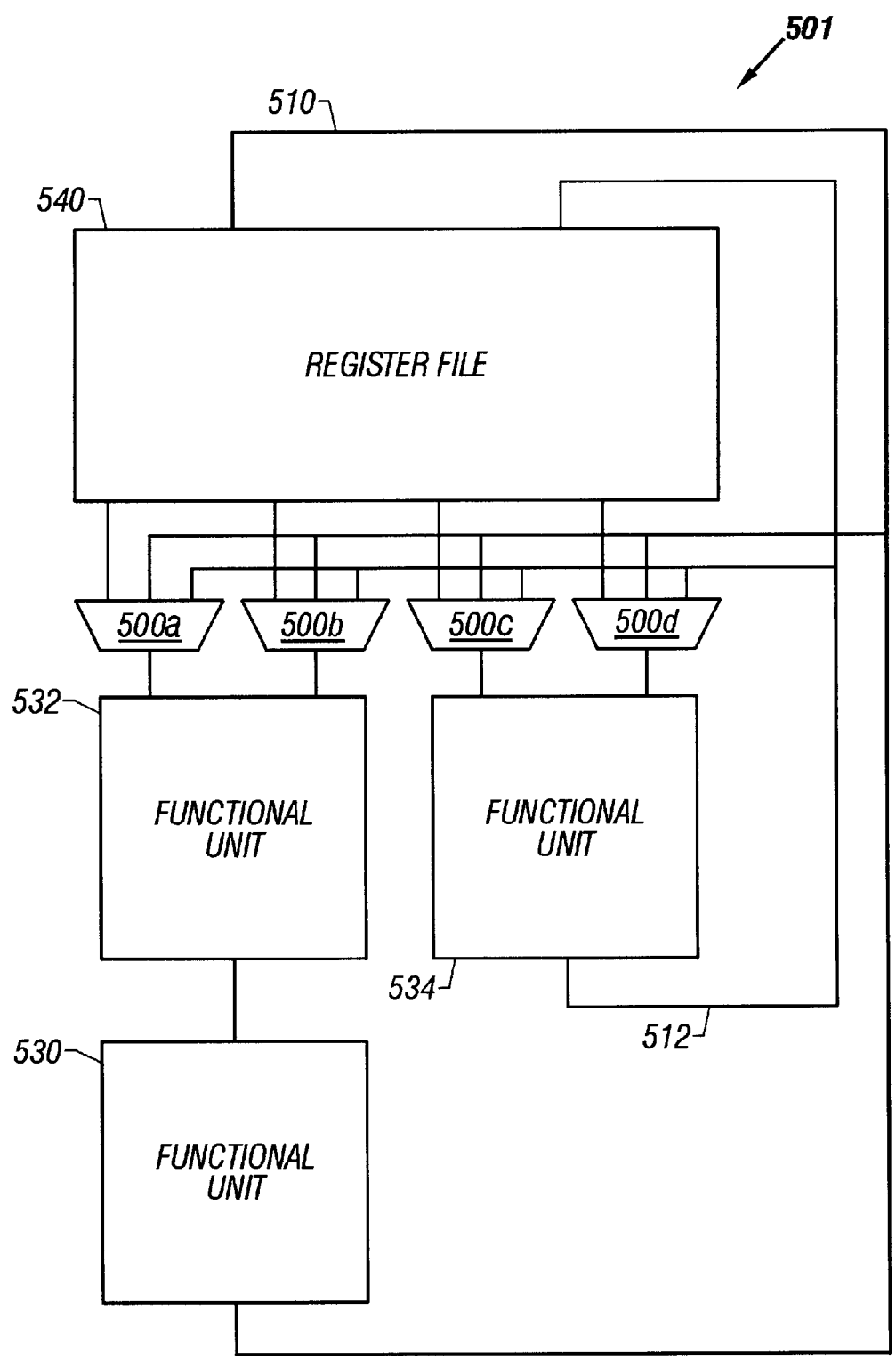
FIG. 5 is a diagram of a prior art traditional super scalar pipeline.

FIG. 5 depicts a typical super scalar pipeline and register file 501 capable of supporting a variety of operations. Register file 540 includes two write ports and four read ports, and feeds the four operand bypass muxes 500$a$, 500$b$, 500$c$, and 500$d$. These bypass muxes feed operand inputs to functional units 532 and 534. Functional unit 532 supports more complex operations than does functional unit 534 and, as such, has not yet produced complete results. It must feed its output to functional unit 530 to complete its operation. The two parallel functional unit paths produce results on result paths 512 and 510. Result path 512 is produced earlier than result path 510 because functional unit 534 produces completed results.

The result paths are connected to the write ports of register file 540, and they also connect to operand bypass muxes 500$a$, 500$b$, 500$c$, and 500$d$. For cases where the results of one instruction is required as an input to a subsequent instruction the operand can be obtained through the appropriate bypass mux 500$a$, 500$b$, 500$c$, or 500$d$ from either result 512 or 510 without having to wait for the result to be written to register file 540. Since instructions tend to depend on results recently produced, these operand bypass pathways are critical to good performance.

FIG. 5 is a super scalar pipeline because it is able to dispatch two instructions at a time. At any point in time, one instruction is in each of the functional units, and two instructions are preparing for dispatch by configuring bypass muxes 500$a$, 500$b$, 500$c$, or 500$d$ to select the appropriate operands, either from results 512 and 510, or from the register file. Since functional unit 534 supports a different set of operations than does the pipelined functional units 532 and 530, it is necessary for the right instructions to show up in the instruction stream in the right order for both to be dispatched. In this figure, the high-latency operations, those implemented by functional units 532 and 530, might be floating point operations that typically require more time to complete than integer operations, and the low-latency operations, those implemented by functional unit 534, are integer operations. For the super scalar pipeline to be efficiently used, integer and floating point instructions must be mixed together in the instruction stream evenly. This rarely occurs, so the pipeline of FIG. 5 tends to be inefficiently used.

Figure 7:
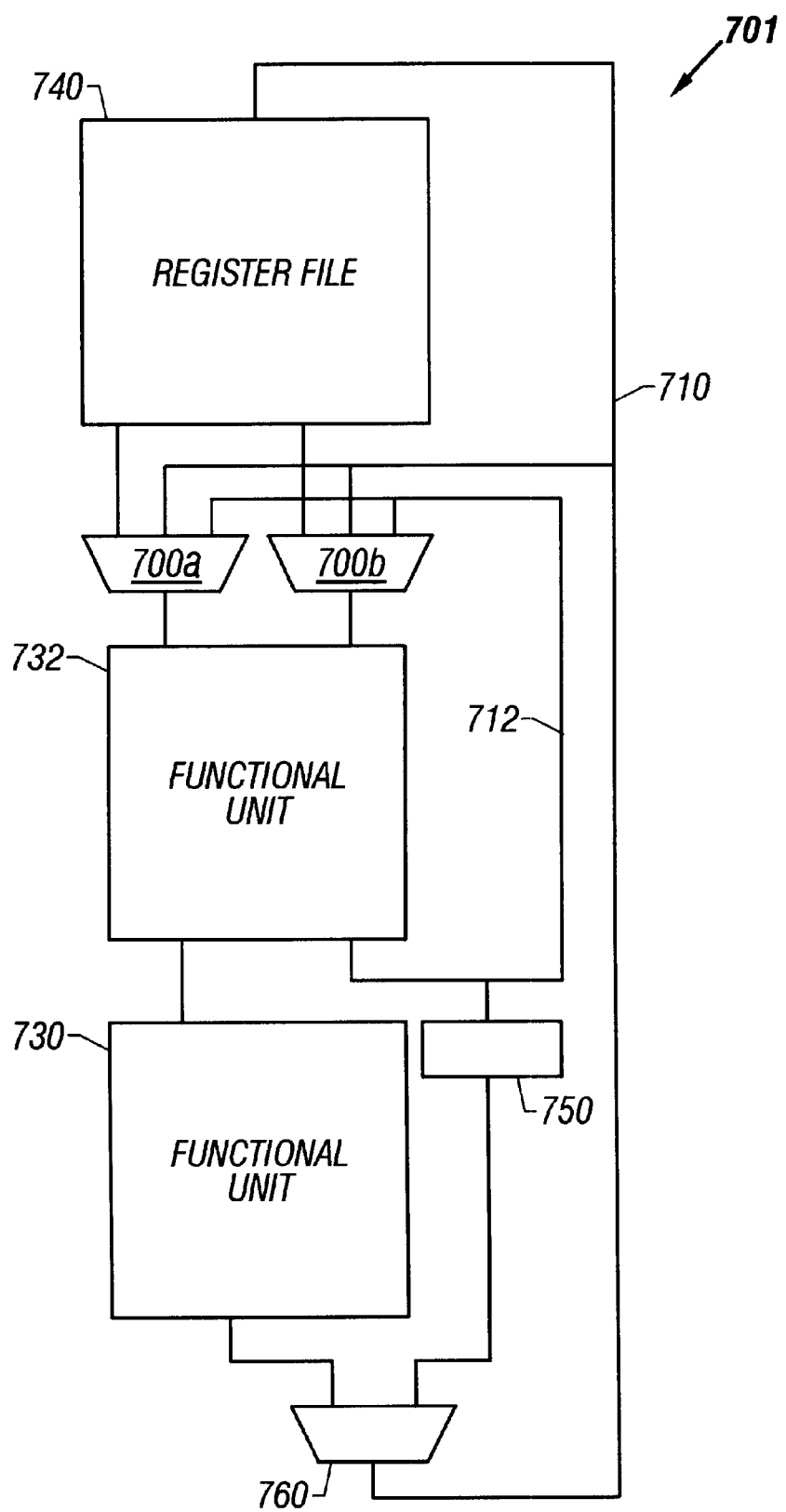
FIG. 7 is a diagram of a uniscalar implementation where one of a multiplicity of functional units produces a result for each instruction.

FIG. 7 attempts to improve the pipeline utilization by eliminating the ability to execute two instructions at a time. This is done because the frequency where two instructions could be executed was already quite low. The primary advantage is that two of the operand bypass muxes 500*c* and 500*d* of FIG. 5 are removed, leaving the operand bypass muxes 700*a* and 700*b*. Furthermore, register file 740 is greatly simplified by the elimination of half of its ports. One innovation of this embodiment of the present invention is the consolidation of the hardware of functional units 532 and 534 of FIG. 5 into a single functional unit 732. This unit performs both the simple integer operations as well as the first part of the more complex operations. The result from functional unit 732 is either complete, in which case it is available for bypassing on result bus 712, and is sent to staging logic 750 for eventual write to the register file. If the result is not complete, result bus 712 will contain a meaningless value and will not be selected. Instead, the value is sent to the second functional block to complete its operation. (In actual fact, the connection between the two functional blocks includes more than just the result. Additional information is typically required to indicate partial results. For example, if the first stage is performing the first portions of a multiplication, it is likely that a redundant sum is sent from the first to the second stage). Once the second functional unit completes its operation it is sent to result select mux 760 such that the appropriate result can be selected depending on the latency of the operation in that stage, either from the second functional unit 730 or from staging 750. The result select mux 760 puts the appropriate result on the result bus 710.

Figure 6:
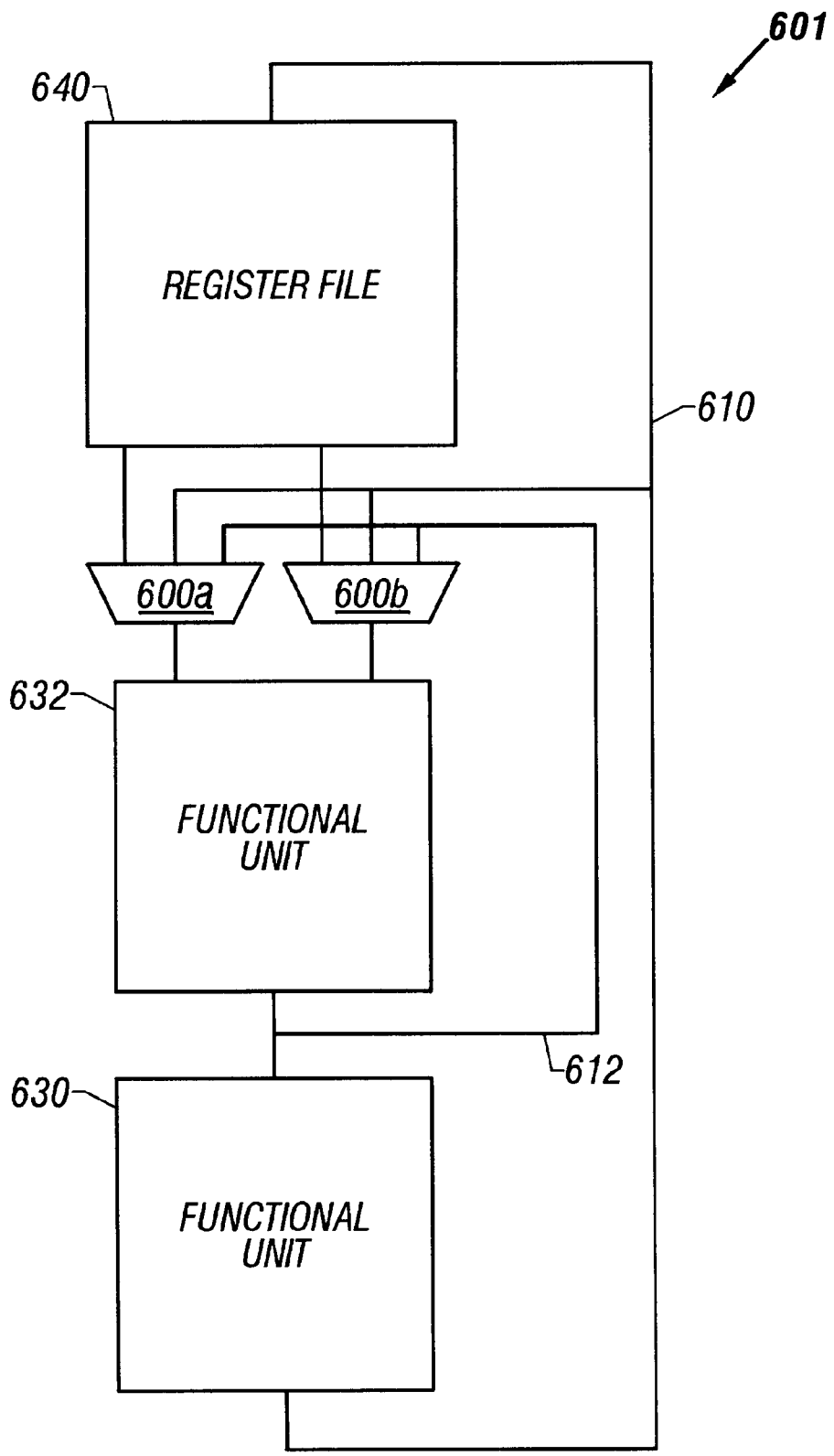
FIG. 6 is a diagram of an embodiment of the invention where results are produced at more than one point in a single pipelined execution unit.

FIG. 6 illustrates an embodiment of the invention, an enhanced floating point unit with graphics and integer capabilities 601, where staging logic 750 and result select mux 760 of FIG. 7 are eliminated. To do this, the second functional unit 630 must be able to pass a completed result unchanged. This is an inexpensive enhancement to the functional unit, and affords both the elimination of hardware (staging logic is expensive in the N-nary latchless logic family), and the removal of a bypass mux on the critical path. The implementation in FIG. 6 is able to support all operations of FIG. 7 with less hardware and less latency. It is also capable of supporting all the functionality of FIG. 5 with much less hardware and similar latency, but with the forfeiture of any ability to execute multiple instructions at a time.

The enhanced floating point unit 601 of FIG.6 comprises a register file 640 that includes 1 write port and 2 read ports, which feeds the bypass muxes 600*a* and 600*b*. The bypass muxes feed operand inputs to a single functional unit 632 that performs both the simple integer operations as well as the first part of more complex operations. The result from function unit 632 is either incomplete, in which case it is available for bypassing on result bus 612, or it is complete or requires additional processing in functional unit 630, which then makes the result available on result bus 610.

The Cost of Different Latencies

Further consolidation of functional units requires arranging their latencies such that similar functions are performed at the same point in a pipeline. FIG. 8 illustrates an embodiment of the present invention 801 that is a multiply-add floating point pipeline that has been enhanced to support integer and graphics instructions.

Floating point operations are algebraic functions on operands that contain both a fraction and an exponent. The inclusion of an exponent allows the operand to represent a wide dynamic range of numbers. That is, a floating point number can be very small, such as 10E−30, or very large, such as 10E+30. These numbers have important applications in the modeling of physical realities. Graphics operations are those that are important for the generation or processing of graphical images. Graphics operations are most commonly performed on pixel values, where each pixel contains three color components, usually red, green and blue. Each component is represented by an eight bit value, and operations are performed on the three eight bit values in parallel. This is called SIMD, which is an acronym for Single Instruction Multiple Data. In this disclosure, we refer to these graphics operations as pixel math. While it may not be obvious that pixel operations and floating point operations are related, they can in fact share many of the same hardware resources, especially when the pipeline need not complicate itself with stall and cancellation hardware.

Floating point instructions typically include multiply, add, and the combination operation multiply-and-add where two operands are multiplied by each other, and the result is added to a third operand. Floating point operations differ from integer operations in that they have both a fraction and an exponent, and special control hardware is required to update the exponent according to the results of the operation. Integer operations are much simpler, but also include multiply, add, and in rare instances multiply-and-add. They also include shifts and boolean operations. Graphics instructions are close cousins to integer operations, and typically include partitioned adds where a single 32-bit operand, for example, is treated as four 8-bit operands packed together. Due to the differences between these operands and the operations performed upon them, processor implementations typically implement separate execution units for each, and argue that the separate execution units allow them to be executed in parallel. While this is true, a key objective of the present invention is to improve the utilization of hardware circuits. To accomplish this, we wish to support integer, graphics, and floating point operations using the same hardware.

Graphics instructions are typically much easier to process than are floating point instructions. While this is true, sharing the same hardware has significant economies. Graphics shift operations can be handled by a floating point operand aligner early in the functional unit, multiply operations can be handled by the floating point multiplier, and add operations can be handled by its adder, which is usually later than the multiplier. This arrangement is somewhat unusual since it means that graphics multiply operations produce their results no later than graphics add operations.

Figure 8A:
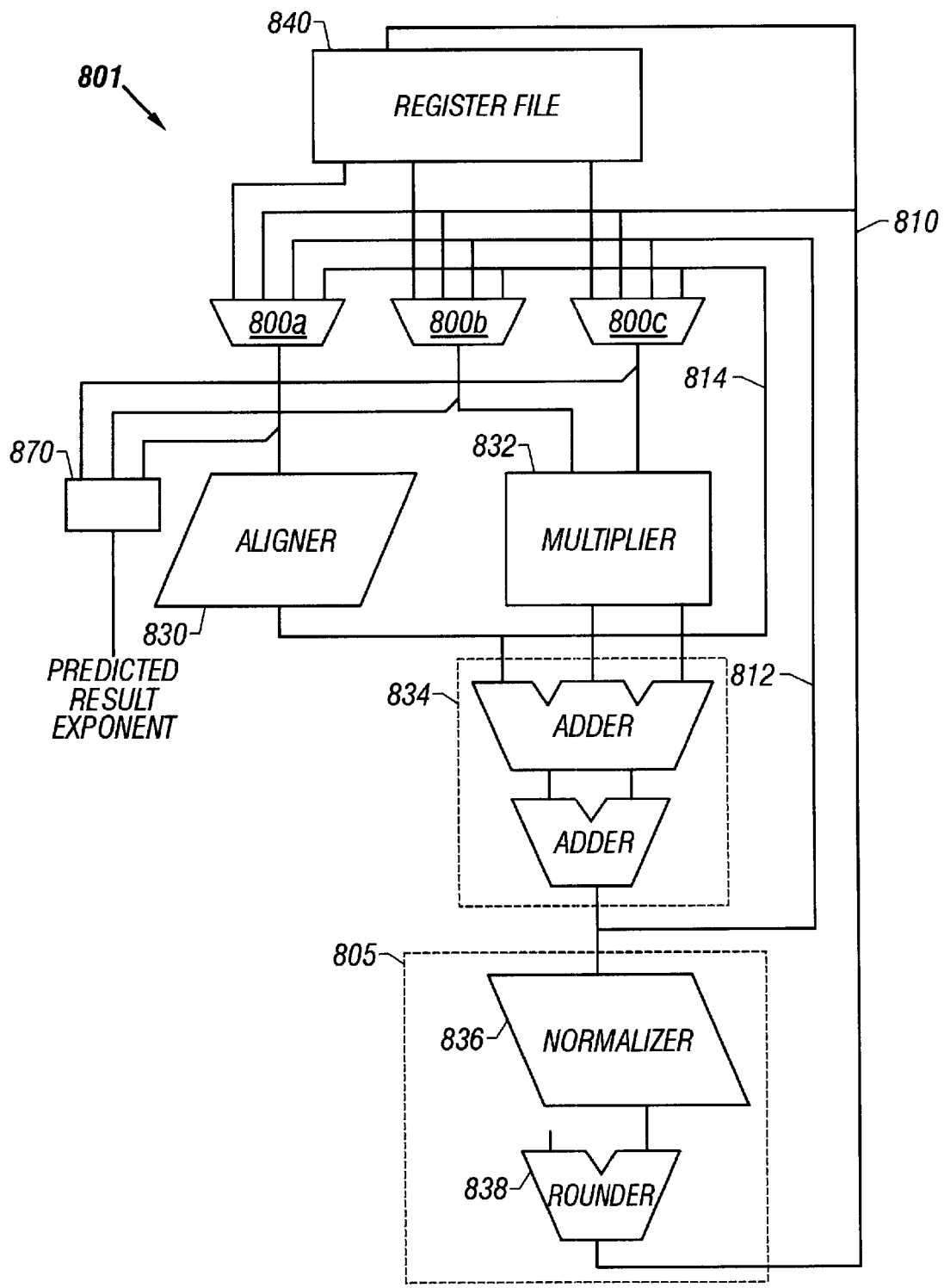
FIGS. 8A and 8B illustrate preferred embodiments of the present invention where floating point operations are implemented in conjunction with graphics and integer operations.

The enhanced floating point pipeline 801 of FIG. 8A also supports integer and graphics instructions (operations). This is most clearly seen by result paths 814 and 812 that are not present in floating point pipelines. Result path 812 is for single cycle integer and graphics shifts, while result path 814 is for 2-cycle integer and graphics add and subtract operations. Register file 840 includes one write port and three read ports. The read ports couple to operand bypass muxes 800*a*, 800*b*, and 800*c* that feed aligner 830 and multiplier 832. The output from the aligner and multiplier connect to a three-port, two-stage adder 834. The output of adder 834 couples to normalizer 836 that in turn couples to rounder 838. The output of the rounder couples to the write port of register file 840. When executing floating point multiply-and-add instructions, multiplier 832 multiplies two of the operands together while aligner 830 places the third operand in the correct position for the subsequent add. Adder 834 totals the redundant sum from the multiplier and the aligned third operand and produces a result that may require normalization. Normalizer 836 adjusts the result such that the most significant bit of the result is set, potentially shifting the result of the adder up as required, and rounder 838 increments the result if necessary. And, a floating point exponent logic 870 predicts the result's exponent (it is just a prediction because normalization may change it further).

To support integer and graphics operations each of the functional units, 830, 832, 834, 836 and 838 are enhanced as follows.

Aligner 830 aligns input operands and is enhanced to shift an input operand according to a shift amount when operating on graphics or integer instructions. This shift result is presented to result bus 814 because it is possible to complete integer and graphics shift instructions within the enhanced aligner. These shift operations include left, right, and right algebraic shifts, but also include operand rearrangement operations popular in graphics instruction sets. The structure of the aligner is very similar to that of a shifter, and horizontal datapath wires are shared, as is most of the aligner hardware. The aligner control is also enhanced to pass its input operand unaffected for operations that do not require shifting.

Multiplier 832 multiplies input operands and is enhanced to accept integer operands, however, because the multiplier produces a redundant sum it is not yet ready to be written to the register file. As a result, no early operand bypass result is made available from the multiplier. The multiplier is also enhanced to pass one of its input operands unaffected for operations that do not require multiplication.

Adder 834 adds input operands and is enhanced to perform integer addition and partitioned graphics addition. Here, a compromise is made between hardware expense and operation latency. When performing integer addition, no actual work is performed in the first portion of the pipeline when operands are traveling through the aligner and multiplier unaffected. It would be possible to provide an adder in parallel with the aligner and multiplier, but this represents additional hardware that is present only to improve addition latency. In the preferred embodiment of the present invention, a redundant adder is considered too expensive.

This embodiment of present invention uses a serial normalizer and rounder 805 that comprises a normalizer 836 and a rounder 838 coupled in series.

Normalizer 836 is enhanced to pass the output of adder 834 unaffected. This is a simple control enhancement since datapath already has the ability to pass values without shifting. Rounder 838 is enhanced to sum multiple results from adder 834. This is useful for graphics instructions that perform summation. For example, a common operation in MPEG encoding is motion estimation, where the result of many parallel subtracts are summed. To support this, the rounder sums each of the partitioned subtracts from the enhanced adder.

The resulting enhanced pipeline of FIG. 8A is able to support common floating point instructions in addition to many integer and graphics operations without adding functional units, register file read or write ports, or additional operand bypass muxes. Intermediate results are made available from within the floating point pipeline for those results that do not require the full pipeline length to be generated. Operand bypass path 814 allows shifts and simple register moves (including operations such as floating point absolute value move) to be available with minimal latency. Integer multiply results are available on operand bypass path 812 since they do not require normalization or rounding. Integer and graphics addition operations are also available on oper- and bypass path 812. Finally, summation instructions, among the most powerful of the graphics instruction set, are made available on final result path 810. Most operations are supported at their minimum latency.

Figure 8B:
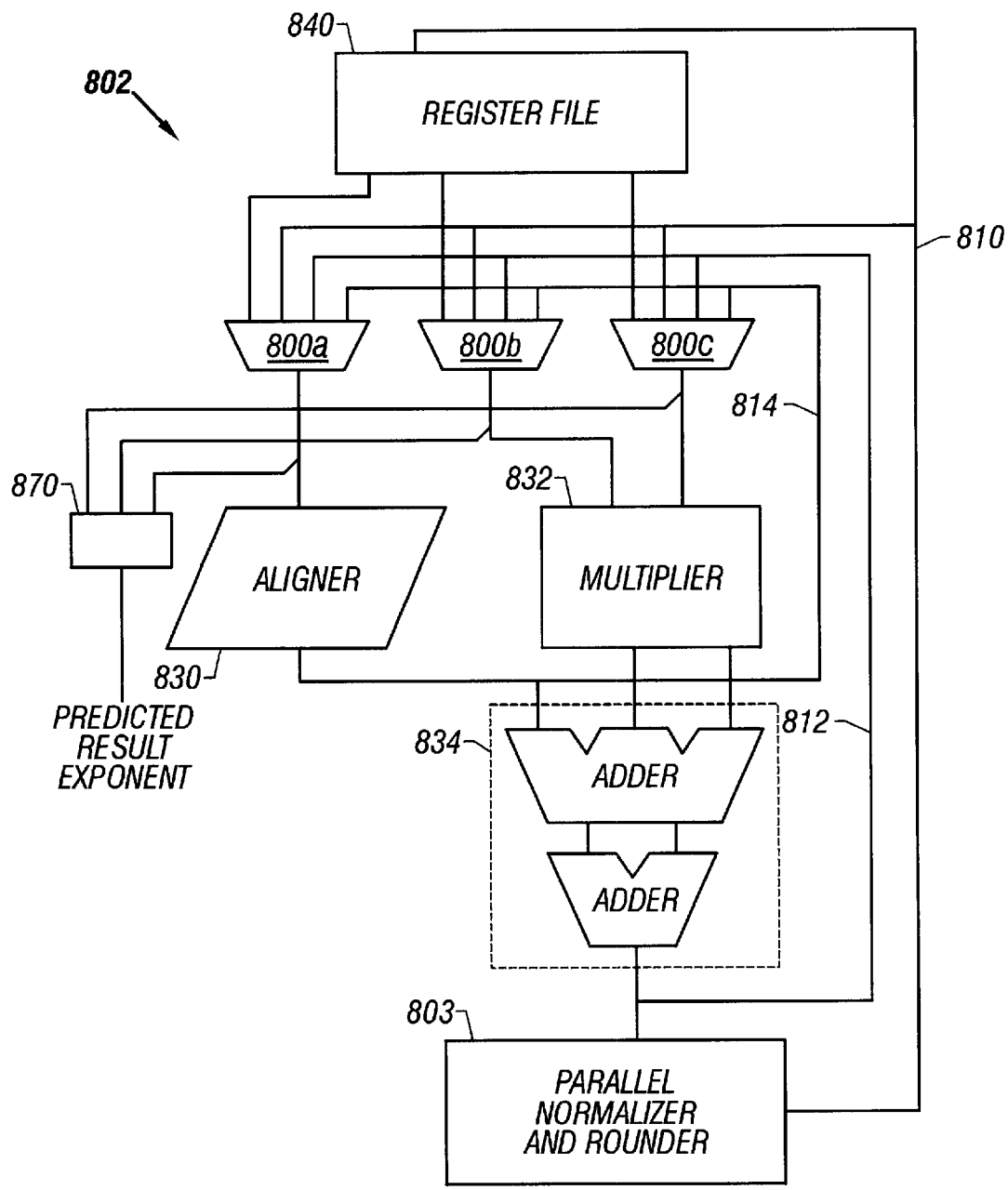

FIG. 8B illustrates an enhanced floating point pipeline 802 that supports integer and graphics operations as does the floating point pipeline 801 of FIG. 8A. The unit 802 of FIG. 8B, however, uses a parallel normalizer and rounder unit 803 instead of the normalizer and rounder coupled in series as in the unit 801 of FIG. 8A. The parallel normalizer and rounder unit 803 is described in greater detail in copending application, U.S. patent application Ser. No. 09/120,775, filed Jul. 22, 1998, entitled "Method and Apparatus for Parallel Normalization and Rounding Technique for Floating Point Arithmetic Operations," now U.S. Pat. No. 6,185, 593 to Brooks et al., and which is incorporated by reference into this application. The normalizer and rounder of the parallel normalizer and rounder unit 803 have the additional enhancements as previously described.

An Example of a Pseudo-Stall

As discussed earlier, an objective of the invention is to eliminate pipeline stalls to improve circuit efficiency. This might seem to suggest that each pipeline stage must require only one cycle to perform its operation for each instruction. After all, if a pipeline stage requires more than one cycle, it will require that all preceding stages stall waiting for it to complete.

This is not entirely true, however. A pipeline stage that requires more than one cycle to perform its operation differs from a pipeline stage that stalls as far as circuit utilization is concerned. The stage is performing useful work in each of its multiple cycles. But, it must not get in the way of preceding stages. Therefore, it is acceptable for a pipeline stage to take multiple cycles so long as the preceding stage is either invalid, or is also taking multiple stages. Verifying this, however, is difficult. We consider here one example implementation for one case where a stage requires multiple cycles, but the concept applies to other examples as well. A difficulty in processing floating point instructions arises when the result of the instruction is a denormal number. Denormal numbers are numbers where the fractional portion of the result must be examined to determine the exponent. When produced, the traditional normalization and rounding hardware is insufficient to produce the correct result. Most floating point implementations handle this either by taking an exception or by taking multiple cycles to produce the result. In either case, the flow of operations through the pipeline is different, and whether it is different depends on the input operands and the operation.

Figure 10A:
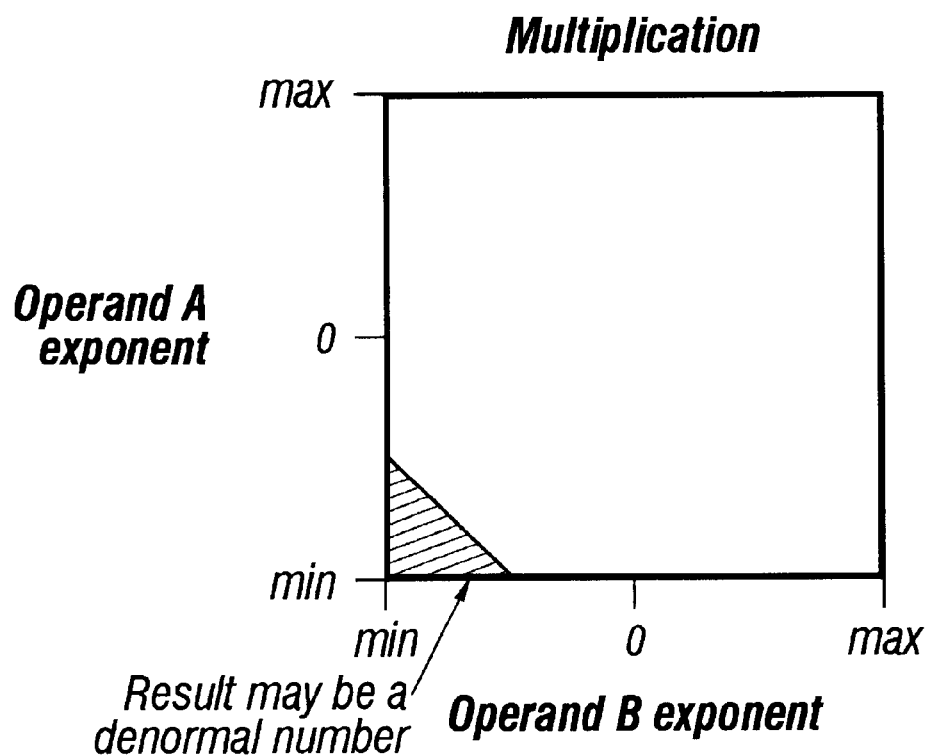
FIGS. 10A and 10B illustrate a range of input exponents for operands to produce a denormal result.
Figure 10B:
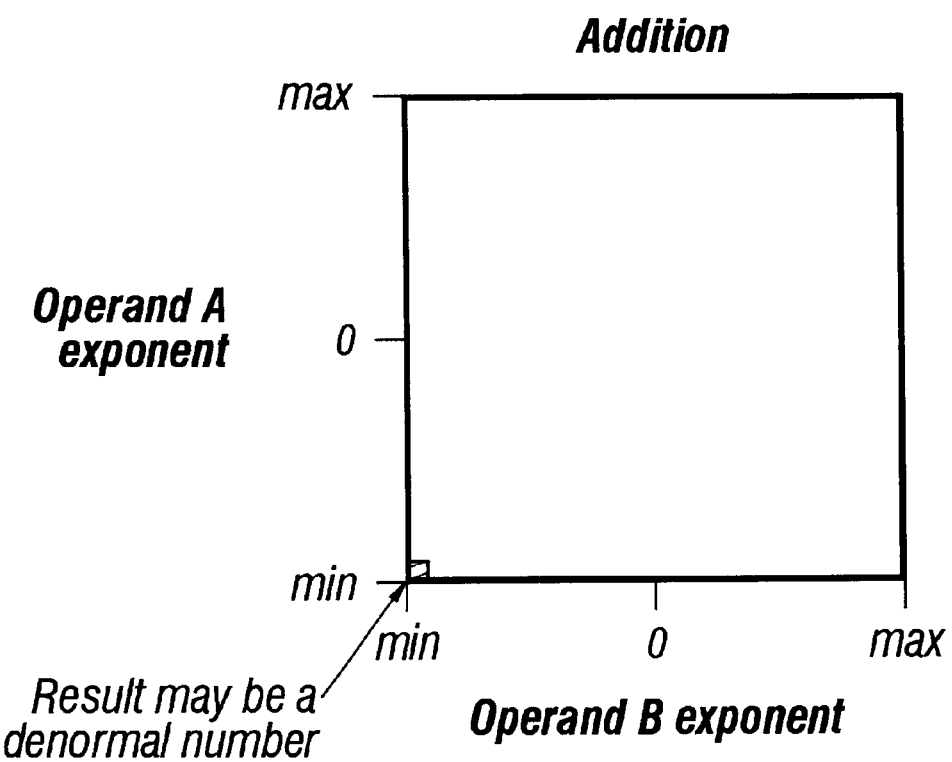

To ensure that preceding pipeline stages are unoccupied when it is determined that multiple cycles are required to process a denormal result, it is necessary to predict the likelihood of a denormal result early in the pipeline and prevent SUBSEQUENT instructions from being dispatched. This is an important innovation. In the case of denormal results, it is possible to examine the exponents of the input operands in conjunction with the desired operation to determine if a denormal result is possible. FIGS. 10A and 10B depicts the range of input exponents for two operands that must be present to possibly encounter a denormal result. The shaded regions in both figures are, in fact, a small portion of the total set of possible input exponents, so the frequency at which denormal results are predicted is actually quite low. This is important because, when a denormal result is predicted, no further instructions can be dispatched until it is known that the result is, in fact, not denormal. Predicting denormal results does not guarantee the result will be denormal, but predicting no denormal result does guarantee the result will not be denormal.

Result prediction is discussed in greater dept in U.S. Pat. No. 4,879,676, issued Nov. 7, 1989 to Hansen, and titled "Method and Apparatus for Precise Floating Point Exceptions," and U.S. Pat. No. 5,633,819, issued May 27, 1997 to Brashears et al. and titled "Inexact Leading-one/Leading-zero prediction integrated with a Floating Point Adder," both patents are incorporated by reference into this disclosure. In the Hansen and Brashears patents, results are predicted to allow early handling of exceptions.

Early-pipe Functional Units vs. Late-pipe Functional Units

Functional units are usually placed early in a processor pipeline so that their results are available at as early a point in time as possible. This is important for two reasons. First, results may be required to generate addresses for memory operand fetches, and second, results may determine the direction a program will progress—that is, they influence conditional jumps. If the results are not available until later, then these operations cannot normally begin.

Conditional jumps are normally predicted. Since there are only two possibilities as to how a program will proceed once it encounters a jump instruction, it is reasonable to predict its outcome. If the prediction scheme has no knowledge of the likely outcome, then a guess is likely to be correct 50% of the time. Typical prediction schemes, however, can achieve accuracies of 75% to 95% on many typical programs. On the other hand, address generations are not predictable because an address that is dependent on an operand that is not available may generate many different addresses. Therefore, late results for address generation are impossible to avoid performance loss, while late values for determining conditional jumps are frequently acceptable performance problems.

The present invention recognizes that graphics and floating point operations less frequently influence conditional jumps (because they are usually a function of table values or iteration counters), and almost never influence address generation. Placing a floating point unit, a graphics unit, or an enhanced floating point unit as previously described late in a pipeline, (as the late pipe unit) therefore, has very little negative performance impact. The application of the present invention to a pipeline structure would mean, for example, that functional unit 130 of FIG. 1 or functional unit 330 of FIG. 3 would be a late pipe unit as described above. In terms of the N-NARY logic family, the functional unit 230 of FIG. 2 and the functional unit 430 of FIG. 4 would be a late pipe unit of the present invention as described above.

A processor pipeline performs many operations for every instruction it executes, some of which are not obvious. An ADD instruction, for example, will configure a pipeline's ALU to do an ADD, but it will also make sure it is on the execution path by examining any older instructions for exceptional conditions or for mispredicted jumps. The instruction may also check itself for exceptions. Furthermore, it will check to ensure its operands are present, and if they are not, it will probably stall waiting for the operands to arrive. All these conditions influence the rate that the instruction proceeds through the pipe and whether it actually completes or not.

Late pipe functional units are those units that do not begin their operation until:

(1) The instruction is known to be on the execution path (there are no older instructions that are either mispredicted jumps or are themselves encountering an exception, and the instruction performing the late pipe operation is also neither a mispredicted jump nor encountering an exception).

(2) All operands are known to be available when they will be required.

(3) There will be a place to send the result once it is complete (i.e., the result is immediately available for use by another functional unit). When these conditions are met, an operation can proceed unhindered to completion without the operation being stalled or canceled.

The beginning of the late pipe functional unit is located in the same pipeline stage as the last unknown from the above list. In a traditional pipeline, this stage immediately follows a stage where operands are fetched from a data cache, which is called the M stage (for tag-Match). This is the stage where the data cache tags are compared with the TLB address to determine if the fetched data was actually present, but it also determines if there was a TLB exception, and in the case of jump instructions determines if the instruction is taken or not, which results in a mispredict determination. Whether a pipeline is super scalar or not does not influence the location of the beginning of the late pipe functional unit. Even if there are multiple instructions in the M stage, all information is available to determine whether a floating point, graphic, or integer instruction will run to completion or not. If there are exceptions, then the pending operation will not begin. If there is a missing operand, then the pending operation will stall waiting for it to become available. Note that this is NOT a stall in the late functional unit since it has not yet begun its operation. If, however, all conditions are favorable, the operation will be started.

The late pipe unit is itself a pipeline, but is a free-running one. Once an operation has begun it will run through the pipeline without stalling to produce its result. While different operations may produce results at different points in the pipeline, the basic operation is still the same. When results are generated before the end of the functional unit, they may be bypassed, but the results will not be written to their destination until the last stage. This prevents results from being written to the register file in the incorrect order.

Handling FPIGP Unit Exceptions

There is some complexity with most floating point operations when exceptions are enabled. If a floating point instruction is configured to indicate an overflow, underflow, or precision exception, then it is possible that the instruction will not complete. This, however, cannot be known until the instruction has at least begun examining the exponents of its operands.

Overflow can occur on multiply instructions if the sum of the exponents is near the maximum possible exponent, or on add instructions if one of the exponents is near the maximum possible. This is easily detected early in the functional unit, but not before the instruction has begun.

Fortunately, we can modify the behavior of the following instruction. The first instruction, which may encounter an exception, can be allowed to proceed down the functional unit pipeline without stalling and without being canceled. If it encounters an exception, the instruction simply does not write its result. The following instruction must not begin its operation until it is known that the first instruction will not encounter an exception. This is handled by not starting the instruction, and stalling in the M stage before the enhanced floating point unit starts working on it.

A floating point instruction is known to not encounter an exception if any of the following are true:

(1) Exceptions are disabled. When exceptions are disabled, a floating point operation delivers a "masked response". That is, it produces the best possible answer it can because it may not be able to produce the exact answer. Exceptions are thus avoided. This is the normal way in which floating point operations are handled.

(2) For multiply operations, neither operand exponent is greater than or equal to half the maximum allowed positive or negative exponent.

(3) For add operations, neither operand exponent is equal to or one less than the maximum allowed positive or negative exponent.

(4) Invalid operations are not present (e.g., operations on SNaNs (signaling not a number) or division by zero).

(5) Inexact exceptions are not enabled. It is practically impossible to predict inexact results.

These conditions are trivial to detect at the beginning of a floating point operation. Therefore, an instruction can identify quickly to a following instruction that it may begin its operation—at least most of the time.

For cases where none of the above conditions are true, it is necessary to prevent the following operation from beginning. This is necessary only so long as the older instruction is still undecided as to its exception status. Once the real exponent result is complete, for example, the following instruction can be allowed to proceed.

Handling Denormal Numbers:

Denormal numbers present a special problem. If a denormal number is produced from an operation, it may take more than the normal number of cycles to correctly align the result. If this occurs, additional time late in the functional unit is required. It is very expensive to build a functional unit pipeline that can handle denormal results in the same time as other results, so we are forced into a compromise on our non-stall pipeline implementation. The compromise, however, is tolerable.

Floating point instructions will only produce denormal results if their intermediate exponent is tiny (a non-zero result value computed as though the exponent range were unbounded would be less in magnitude than the smallest normalized number). This does not happen often, and can be predicted early in the pipeline. It is therefore very similar to detecting underflow exceptions. Denormal numbers, however, may be generated as a "masked response", so we cannot avoid the condition by disabling floating point exceptions. Instead, when the possibility of a denormal result is detected, we must prevent the next instruction from beginning until we know the actual exponent result. In this case, if the exponent exceeds the maximum negative exponent by a wide enough margin, we can know that the result is so small it will return the masked result, or zero. So, the detect condition is both an upper and a lower boundary instead of just one boundary.

The compromise to the non-stall pipeline is that no instruction will be allowed to begin until any instruction that may produce a denormal result has completed the processing of that result. Since the result is processed (aligned) at the end of the pipeline, there are no older instructions present, and no younger ones have been allowed to begin. The denormal producing instruction, therefore, has the entire functional unit to itself. The single pipeline stage that is involved in processing the denormal operand has a feedback path to shift the result, and will continue shifting the result until it is aligned. The shift may be by one bit at a time, or more than one, but at least one additional cycle will be required in this stage of the late pipe functional unit.

No other stages in the functional unit are affected. They can continue to propagate non-valid operations unhindered, and any stages after the denormalizing stage can also proceed so long as they do not attempt to write a result. The complexity and cost of the functional unit is hardly compromised by this implementation.

To summarize, the present invention comprises a method and apparatus for an enhanced floating point unit that supports floating point, integer, and graphics operations by combining the units into a single functional unit. The enhanced floating point unit comprises a register file coupled to a plurality of bypass multiplexers. Coupled to the bypass multiplexers are an aligner and a multiplier. And, coupled to the multiplier is an adder that further couples to a normalizer/rounder unit. The normalizer/rounder unit may comprise a normalizer and a rounder coupled in series and or a parallel normalizer/rounder. The enhanced floating point unit of the present invention supports both integer operations and graphics operations with one functional unit.

Additionally, the present invention comprises a method and apparatus for a pipeline of functional units with a late pipe functional unit that executes instructions without stalling until the result is available. The present invention comprises one or more earlier functional units coupled to a late pipe functional unit. The late pipe functional unit does not begin executing instructions until all of the input operands are or will be available for execution so that the late pipe functional unit will execute instructions without stalling until the result will be available in a fixed number of cycles. The present invention further comprises a late pipe functional unit that may comprise a floating point unit, a graphics unit, or an enhanced floating point unit. And finally, the late pipe functional unit is non-stalling and or is non-cancelable.

Other embodiments of the invention will be apparent to those skilled in the art after considering this specification or practicing the disclosed invention. The specification and examples above are exemplary only, with the true scope of the invention being indicated by the following claims.

We claim the following invention:

1. A pipeline of N-NARY functional units that use a latchless clocking method for logic synchronization with a late pipe N-NARY functional unit that executes instructions without stalling until the result is available, comprising:

one or more earlier N-NARY functional units; and a late pipe N-NARY functional unit coupled to said earlier N-NARY functional unit, said late pipe N-NARY functional unit does not begin executing instructions until all of the input operands are or will be available for execution so that said late pipe N-NARY functional unit will execute instructions without stalling until the result will be available in a fixed number of cycles wherein said earlier N-NARY functional units and said late pipe N-NARY functional unit use a latchless clocking method for logic synchronization.

2. A method of providing a pipeline of functional units that use a latchless clocking method for logic synchronization with a late pipe N-NARY functional unit that executes instructions without stalling until the result is available, comprising:

providing one or more earlier N-NARY functional units; and coupling a late pipe N-NARY functional unit coupled to said earlier N-NARY functional unit, said late pipe N-NARY functional unit does not begin executing instructions until all of the input operands are or will be available for execution so that said late pipe N-NARY functional unit will execute instructions without stalling until the result will be available in a fixed number of cycles wherein said earlier N-NARY functional units and said late pipe N-NARY functional unit use a latchless clocking method for logic synchronization.

3. A method of pipelining instructions and operands with a pipeline of N-NARY functional units that use a latchless clocking method for logic synchronization with a late pipe N-NARY functional unit that executes instructions without stalling until the result is available, comprising:

pipelining the instruction through one or more earlier N-NARY functional units; and executing the instruction in a late pipe N-NARY functional unit coupled to said earlier N-NARY functional unit, said late pipe N-NARY functional unit does not begin executing instructions until all of the input operands are or will be available for execution so that said late pipe N-NARY functional unit will execute instructions without stalling until the result will be available in a fixed number of cycles wherein said earlier N-NARY functional units and said late pipe N-NARY functional unit use a latchless clocking method for logic synchronization.

4. A system of pipelining instructions and operands with a pipeline of functional units that use a latchless clocking method for logic synchronization with a late pipe N-NARY functional unit that executes instructions without stalling until the result is available, comprising:

one or more earlier N-NARY functional units; and a late pipe N-NARY functional unit coupled to said earlier N-NARY functional unit, said late pipe N-NARY functional unit does not begin executing instructions until all of the input operands are or will be available for execution so that said late pipe N-NARY functional unit will execute instructions without stalling until the result will be available in a fixed number of cycles wherein said earlier N-NARY functional units and said late pipe N-NARY functional unit use a latchless clocking method for logic synchronization.

5. A dependent claim according to claim 1, 2, 3, or 4 wherein said late pipe N-NARY functional unit comprises a floating point unit.

6. A dependent claim according to claim 1, 2, 3, or 4 wherein said late pipe N-NARY functional unit comprises a graphics unit.

7. A dependent claim according to claim 1, 2, 3, or 4 wherein said late pipe N-NARY functional unit comprises an enhanced floating point unit.

8. A dependent claim according to claim 1, 2, 3, or 4 wherein said late pipe N-NARY functional unit is non-stalling.

9. A dependent claim according to claim 1, 7, 13, or 4 wherein said late pipe N-NARY functional unit is non-cancelable.

\* \* \* \* \*